United States Patent
Chen et al.

(10) Patent No.: US 8,736,349 B2
(45) Date of Patent: May 27, 2014

(54) CURRENT LIMIT CIRCUIT APPARATUS

(75) Inventors: Tsung-Lin Chen, Taipei (TW); Edward Yi Chang, Hsinchu (TW); Wei-Hua Chieng, Hsinchu (TW); Stone Cheng, Hsinchu (TW); Shyr-Long Jeng, Hsinchu (TW); Shin-Wei Huang, New Taipei (TW)

(73) Assignee: National Chiao Tung University, Hsinchu (TW)

( * ) Notice: Subject to any disclaimer, the term of this patent is extended or adjusted under 35 U.S.C. 154(b) by 16 days.

(21) Appl. No.: 13/596,104

(22) Filed: Aug. 28, 2012

(65) Prior Publication Data
US 2013/0241603 A1  Sep. 19, 2013

(30) Foreign Application Priority Data
Mar. 15, 2012 (TW) .............................. 101108776 A

(51) Int. Cl.
*H03K 17/687* (2006.01)

(52) U.S. Cl.
USPC ............ 327/427; 327/434; 327/435; 327/391

(58) Field of Classification Search
None
See application file for complete search history.

(56) References Cited

U.S. PATENT DOCUMENTS

| | | | | |
|---|---|---|---|---|
| 3,621,284 A | * | 11/1971 | Cluett et al. ................... | 327/308 |
| 5,821,797 A | * | 10/1998 | Kinugasa et al. ............. | 327/318 |
| 7,408,396 B2 | * | 8/2008 | El-Khoury et al. ........... | 327/318 |
| 7,791,399 B2 | * | 9/2010 | Zhou et al. ..................... | 327/340 |
| 8,248,148 B2 | * | 8/2012 | Chen .............................. | 327/434 |
| 2005/0285661 A1 | * | 12/2005 | Wittenbreder, Jr. ........... | 327/434 |
| 2012/0119817 A1 | * | 5/2012 | Chen et al. ..................... | 327/434 |

* cited by examiner

*Primary Examiner* — Tuan T Lam
(74) *Attorney, Agent, or Firm* — Bacon & Thomas, PLLC

(57) ABSTRACT

The present invention provides a current limit circuit apparatus, coupled with the gate of a GaN transistor. The current limit circuit comprises a diode, a first transistor, a second transistor, a first resistor, a second resistor, a third resistor and a fourth resistor. The source and the drain of the first transistor couple with the diode. The source of the second transistor couples with the gate of the first transistor. The source of the first transistor couples with the first transistor. The source of the second transistor couples with the second resistor. The third resistor couples with the fourth resistor and the gate of the first transistor. The first transistor turned off and the gate current is limited. When the current of the gate of the GaN transistor exceeds the predetermined value, the breakdown voltage is increased by limiting the gate current.

7 Claims, 4 Drawing Sheets

CURRENT LIMIT CIRCUIT APPARATUS

BACKGROUND OF THE INVENTION

1. Field of the Invention

The present invention relates to a current limit circuit apparatus, more particularly to a current limit circuit apparatus for limiting the gate current of the GaN transistor, in order to increase the breakdown voltage of the GaN transistor by limiting the gate current of the GaN transistor.

2. Description of the Prior Art

The GaN is a wide band gap semiconductor with quick switching capability. It is a high-frequency operated electronic device for bringing great change to the communication technology. Except this, it has high breakdown voltage, and it is also one of the best materials for manufacturing of the high-power transistor and will bring the revolutionary change to the high-power device.

The conventional way for increasing the breakdown voltage of GaN transistor is to use different process or change the material of device, the technical level is higher and the cost is also higher. How to increase the breakdown voltage of GaN transistor without changing the process and material has become one of the topics endeavored by the industry.

Please referring to FIG. 1, which shows the relation between the leaking current at the output/input end of AlGaN/GaN transistor and the voltage of drain-source. As shown in FIG. 1, when the AlGaN/GaN transistor is operated at the cut-off region, the leaking current is increased with the voltage difference (Vds) of the drain and the source. When the breakdown voltage is achieved, almost all leaking current of the drain flows to the gate. Upon using the abovementioned feature, when the AlGaN/GaN transistor is turned off and the current flown from the drain to the gate is limited, the breakdown voltage of GaN transistor will be increased.

Therefore, a current limit circuit apparatus coupled with the gate of a GaN transistor is required to limit the current flown out of the gate, in order to increase the breakdown voltage of GaN transistor.

SUMMARY OF THE INVENTION

In order to increase the breakdown voltage of GaN transistor without changing the process condition and device material, the present invention provides a current limit circuit apparatus for limiting the gate current of the GaN transistor, so as to increase its breakdown voltage.

In order to achieve the abovementioned purpose, the present invention provides a current limit circuit apparatus suitable for the GaN transistor. The process parameters need not to be changed, and the finished GaN transistor can be used directly. The circuit design is used to limit the gate current of the GaN transistor for increasing its breakdown voltage. The designer can have the flexible design, and reduce the manufacturing cost.

Based on the abovementioned purpose, the present invention provides a current limit circuit apparatus, coupled with the gate of a GaN transistor. The current limit circuit comprises a diode, a first transistor, a second transistor, a first resistor, a second resistor, a third resistor and a fourth resistor. The source and the drain of the first transistor couple with the diode. The drain of the second transistor couples with the gate of the first transistor. The first resistor couples with the diode and the source of the first transistor. One end of the second resistor couples with the source of the second transistor and a first power supply. One end of the third resistor couples with the fourth resistor and the gate of the first transistor. The other end of the third resistor couples with the gate of the second transistor and the other end of the second resistor. The drain of the first transistor couples with one end of the diode and the gate of the GaN transistor. The first transistor turned off and the gate current is limited. When the current of the gate of the GaN transistor exceeds the predetermined value, the breakdown voltage is increased by limiting the gate current.

Another purpose of the present invention is to provide a current limit circuit apparatus. The current limit circuit further comprises a fifth resistor, a sixth resistor, a third transistor and a fourth transistor. The fifth resistor couples with the third resistor and the gate of the first transistor. The drain of the third transistor couples with the fifth resistor. The source of the third transistor couples with a second power supply. The source of the fourth transistor couples with a second power supply. The drain of the fourth transistor couples with the sixth resistor.

The gate of the fourth transistor couples with the drain of the first transistor and the gate of the GaN transistor. After the GaN transistor is turned of through the switch of the third transistor and the fourth transistor, the first transistor is turned off to limit the leaking current flown out from the gate of the GaN transistor, so as to increase the breakdown voltage of the GaN transistor.

In order to further understand the abovementioned and other purposes, features and advantages of the present invention, the preferred embodiments and Figures are attached and described in detail as follows.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention can be further understood through the following Figures and detailed description. The following embodiments are used for the detailed description, but the scope of the present invention is not limited by the following embodiments.

Figure 1:
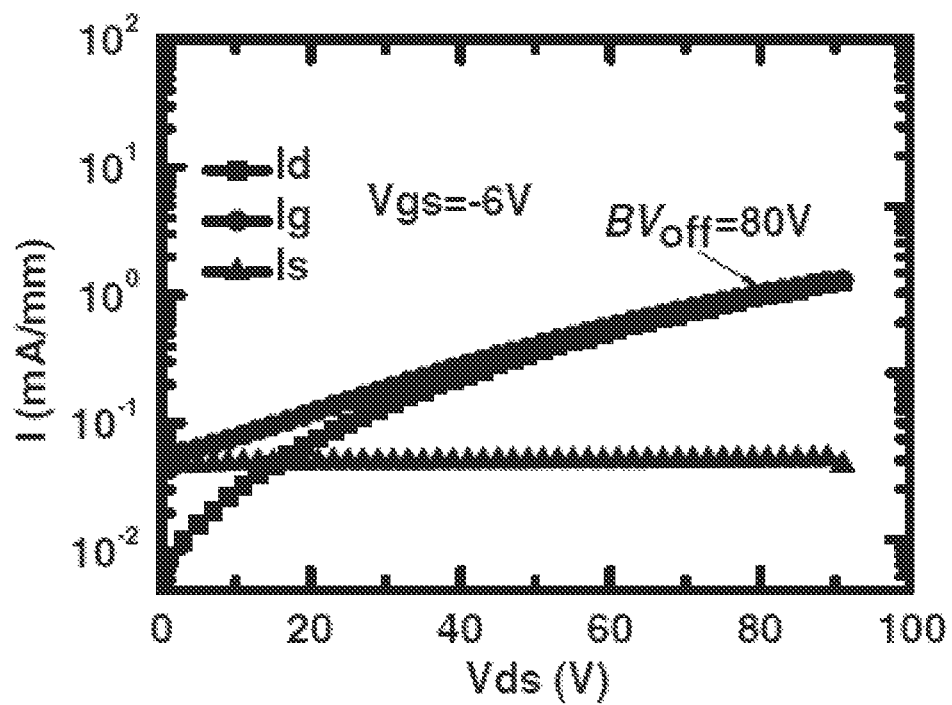
FIG. 1 shows the relation between the leaking current at the output/input end of AlGaN/GaN transistor and the voltage of drain-source.
Figure 2:
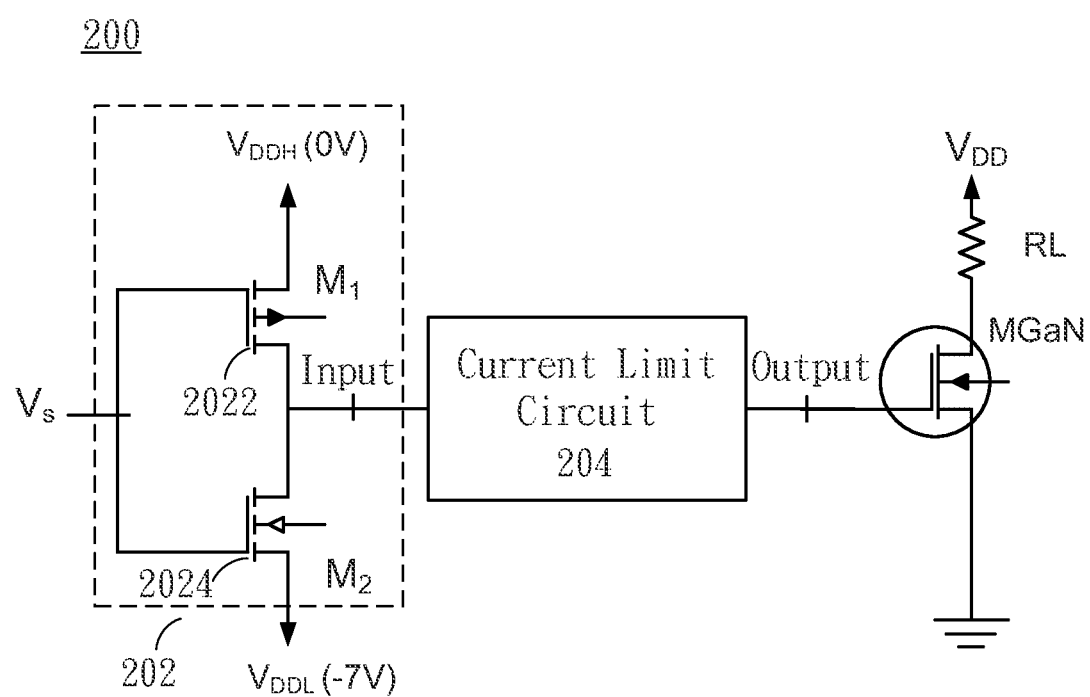
FIG. 2 is a diagram illustrating the GaN circuit apparatus for an embodiment of the present invention.

FIG. 2 is a diagram illustrating the GaN circuit apparatus for an embodiment of the present invention. As shown in FIG. 2, the GaN circuit apparatus 200 comprises a transistor drive circuit 202, a current limit circuit 204 and a GaN transistor $M_{GaN}$. The current limit circuit 204 couples with the transistor drive circuit 202 and the GaN transistor $M_{GaN}$, and the current limit circuit 204 couples with the gate of the GaN transistor $M_{GaN}$. The transistor drive circuit 202 includes a P-type metal-oxide-semiconductor (PMOS) field transistor 2022 and an N-type metal-oxide-semiconductor (NMOS) field transistor 2024. The P-type metal-oxide-semiconductor (PMOS) field transistor 2022 connects to a high voltage source $V_{DDH}$. The N-type metal-oxide-semiconductor (NMOS) field transistor 2024 connects to a low voltage source $V_{DDL}$ (this low voltage source $V_{DDL}$ uses the same low voltage source as the transistor drive circuit 202). In this embodiment, the high voltage source is $V_{DDH}=0V$, and the low voltage source is $V_{DDL}=-7V$. The transistor drive circuit 202 control to switch the P-type metal-oxide-semiconductor (PMOS) field transistor 2022 and the N-type metal-oxide-semiconductor (NMOS) field transistor 2024 in accordance with the input voltage $V_s$. In the Figure, the source and the drain of the first transistor $M_1$ couple with the diode D. The source of the second transistor $M_2$ couples with the gate of the first transistor $M_1$.

Figure 3:
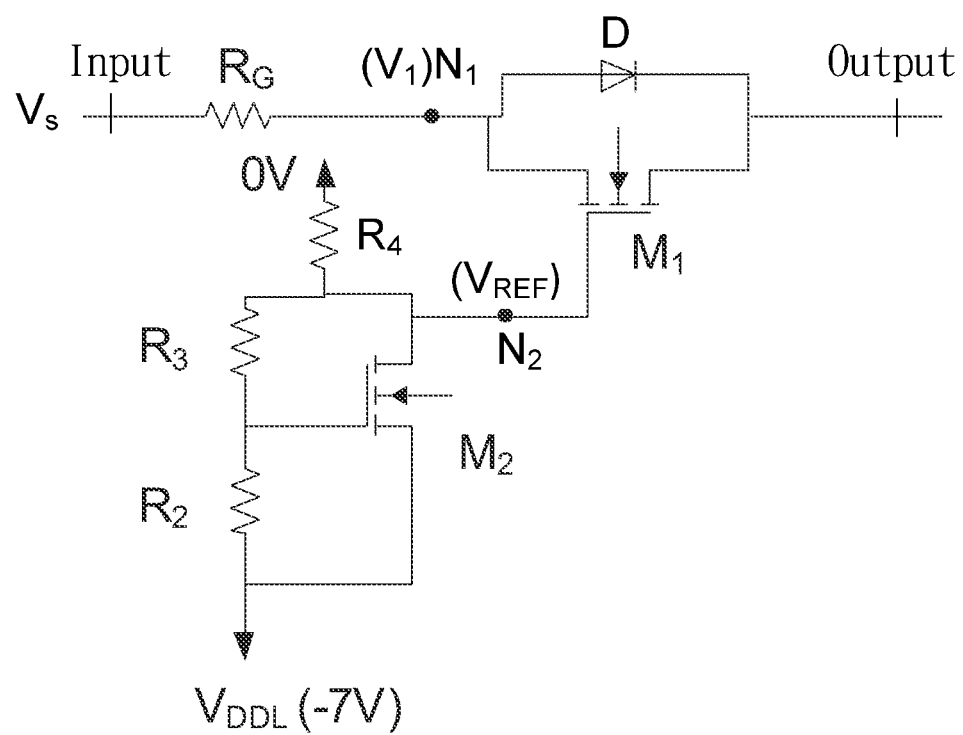
FIG. 3 is a diagram illustrating the current limit circuit apparatus for a preferred embodiment of the present invention.

FIG. 3 is a diagram illustrating the current limit circuit apparatus for a preferred embodiment of the present invention. As shown in the Figure, the first resistor Ro couples with the diode D and the source of the first transistor $M_1$. One end of the second resistor $R_2$ couples with the source of the second transistor $M_2$ and the first power supply $V_{DDL}$. One end of the third resistor $R_3$ couples with the fourth resistor $R_4$ and the gate of the first transistor $M_1$. The other end of the third resistor $R_3$ couples with the gate of the second transistor $M_2$, and the other end of the second resistor $R_2$. The drain of the first transistor $M_1$ couples with the other end of the diode D and the gate of the GaN transistor $M_{GaN}$.

Please referring to FIG. 2 and FIG. 3, when $V_s=V_{DDL}$ is inputted, the P-type metal-oxide-semiconductor (PMOS) field transistor 2022 will be conducted. The current will flow from the high voltage source $V_{DDH}$ to the GaN transistor $M_{GaN}$ through the diode for turning on the GaN transistor $M_{GaN}$. When $V_s=V_{DDH}$ is inputted, the N-type metal-oxide-semiconductor (NMOS) field transistor will be conducted. The current will flow from the gate of the GaN transistor $M_{GaN}$ to the low voltage source $V_{DDL}$. At this time, the voltage of the node $N_1$ is $V_1=V_{DDL}+\Delta V$, where $\Delta V$ represents the voltage drop of the first resistor $R_G$.

The voltage of the node $N_2$ is:

$$V_{REF} = V_{th}\left(\frac{R_2+R_3}{R_2}\right) + V_{DDL}$$

where $V_{th}$ represents the critical voltage of the first transistor $M_1$ and the second transistor $M_2$, $R_2$ is the second resistor, and $R_3$ is the third resistor. The conducting condition of the first transistor can be represented as:

$$V_{REF}-V_1 > V_{th}$$

where $V_{REF}$ is the voltage of the node $N_2$. The above equation is substituted into this equation to get:

$$\Delta V < V_{th}\frac{R_3}{R_2}$$

It is known that $\Delta V$ represents the voltage drop of the first resistor $R_G$, therefore:

$$\Delta V = i_G R_G$$

This equation is substituted into $\Delta V$ to obtain:

$$i_G < V_{th}\frac{R_3}{R_2 R_G}$$

It means when the gate current flown from the gate of the GaN transistor $M_{GaN}$ is:

$$i_G < V_{th}\frac{R_3}{R_2 R_G}$$

(predetermined value), the first transistor $M_1$ will be turned on. On the contrary, when the gate current $i_G$ is too large (higher than the above predetermined value), the first transistor $M_1$ will be turned off and the gate current $i_G$ will be limited, in order to increase the breakdown voltage of the GaN transistor $M_{GaN}$. The first transistor $M_1$ and the second transistor $M_2$ are the N-type metal-oxide-semiconductor (NMOS) field transistors.

Figure 4:
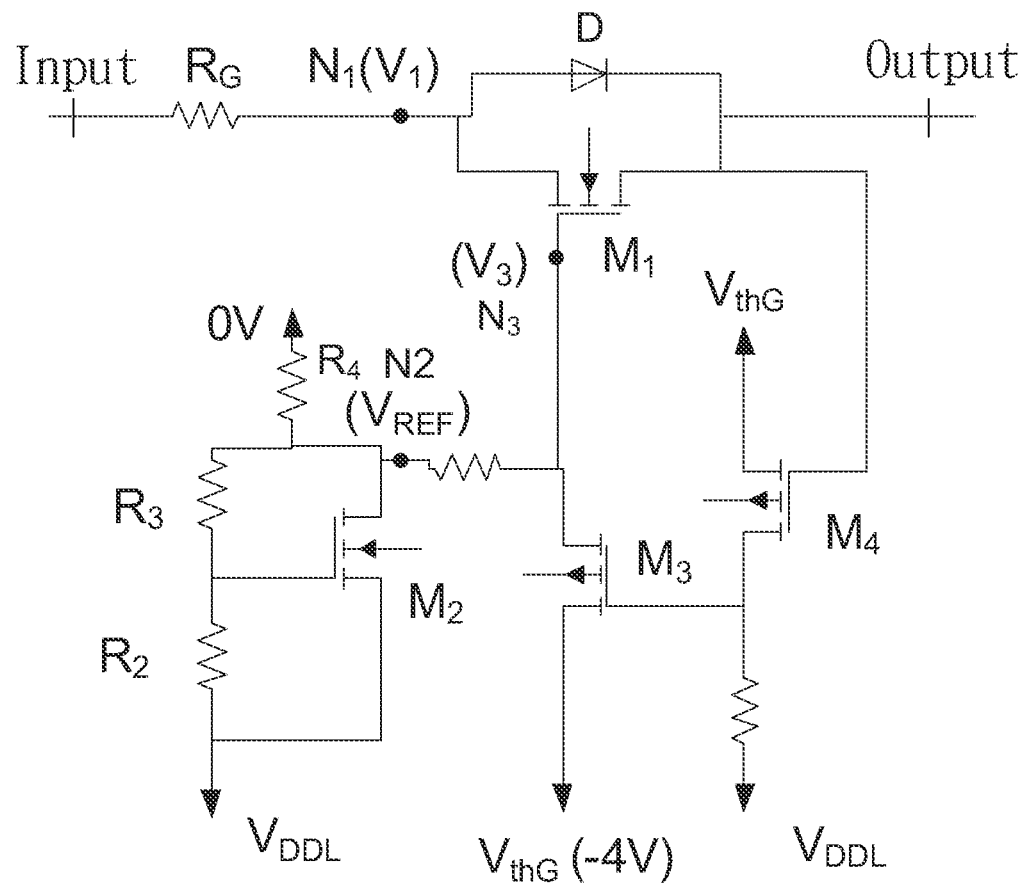
FIG. 4 is a diagram illustrating the current limit circuit apparatus for another preferred embodiment of the present invention.

As for another embodiment, please referring to FIG. 2 and FIG. 4. FIG. 4 is a diagram illustrating the current limit circuit apparatus for another preferred embodiment of the present invention. The difference between this embodiment and the above embodiment is that the third transistor $M_3$ and the fourth transistor $M_4$ are added to modify the activating time of the current limit circuit. Because, when the GaN transistor $M_{GaN}$ is turned off quickly, the simultaneous current of the gate will be very large. If the current is limited at this time, the turn-off speed of the GaN transistor $M_{GaN}$ will be reduced, even the current limit circuit shown in FIG. 4 started to limit the current only after the GaN transistor $M_{GaN}$ is turned off. The fifth resistor $R_5$ couples with the third resistor $R_3$ and the gate of the first transistor $M_1$. The drain of the third transistor $M_3$ couples with another end of the fifth resistor $R_5$. The source of the third transistor $M_3$ couples with the second power supply $V_{thG}$ (i.e. the critical voltage of the GaN transistor $M_{GaN}$).

As shown in FIG. 4, when the GaN transistor $M_{GaN}$ is turn on and off, the gate voltage is about 0V. At this time, the third transistor $M_3$ is conducted, the fourth transistor $M_4$ is not conducted, and the voltage $V_3$ of the node $N_3$ is almost equivalent to the critical voltage $V_{thG}$ of the GaN transistor $M_{GaN}$. In this embodiment, the critical voltage $V_{thG}=-4V$. Then the first transistor $M_1$ is conducted, the current flows from the gate of the GaN transistor $M_{GaN}$ smoothly until the gate voltage reaches about the critical voltage $V_{thG}$, in order to assure the GaN transistor $M_{GaN}$ is turned off. Then, the gate voltage of the GaN transistor $M_{GaN}$ is reduced continuously, so that the third transistor $M_3$ is not conducted, the fourth transistor $M_4$ is conducted, and the voltage $V_3$ of the node $N_3$ is equivalent to the voltage $V_{REF}$ of the node $N_2$ specified in the above embodiment shown in FIG. 3. This embodiment assures the turn-off of the GaN transistor $M_{GaN}$, in order to modify the turn-on and turn-off time of the GaN transistor $M_{GaN}$. Because, its simultaneous current closes to the breakdown current of the gate, the turn-off speed of the GaN transistor $M_{GaN}$ will be reduced. The third transistor $M_3$ and the fourth transistor $M_4$ are the P-type metal-oxide-semiconductor (PMOS) field transistors.

A circuit design method is provided by the present invention for the above two embodiments. Under the normal switch of the GaN transistor is unaffected, a current limit circuit is coupled with the transistor drive circuit and the GaN transistor to limit the gate current of the GaN transistor, in order to increase the breakdown voltage (i.e. the drain-source voltage) at the turn-off of the GaN transistor. The prior art can be improved by process design, process parameters or device design, in order to solve the drawbacks of inflexible design and high cost.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A current limit circuit apparatus, coupled with the gate of a GaN transistor, the current limit circuit comprises:
   a diode;
   a first transistor, a source and a drain of the first transistor coupling with the diode;
   a second transistor, a source of the second transistor coupling with a gate of the first transistor;
   a first resistor, the first resistor coupling with the diode and a drain of the first transistor;
   a second resistor, one end of the second resistor coupling with a source of the second transistor and a first power supply; and
   a third resistor, one end of the third resistor coupling with a fourth resistor and the gate of the first transistor, another end of the third resistor coupling with a gate of the second transistor and another end of the second resistor;
   wherein the drain of the first transistor coupling with one end of the diode and a gate of the GaN transistor, the first transistor turning off and a current of the gate of the GaN transistor being limited, when the current of the gate of the GaN transistor exceeding a predetermined value, a breakdown voltage of the GaN transistor being increased by limiting a gate current.

2. The apparatus according to claim 1, further comprising:
   a fifth resistor, the fifth resistor coupling with a third resistor and a gate of the first transistor;
   a third transistor, a drain of the third transistor coupling with an end of the fifth resistor, a source of the third transistor coupling with a second power supply;
   a fourth transistor, a source of the fourth transistor coupling with the second power supply, a drain of the fourth transistor coupling with another end of the sixth resistor;
   wherein a gate of the fourth transistor coupling with a drain of the first transistor and a gate of the GaN transistor, after the GaN transistor being turned of through a switch of the third transistor and the fourth transistor, the first transistor being turned off to limit the leaking current flown out from the gate of the GaN transistor, so as to increase a breakdown voltage of the GaN transistor.

3. The apparatus according to claim 2, wherein the second power supply is a critical voltage of the GaN transistor.

4. The apparatus according to claim 2, wherein the current limit circuit apparatus automatically activate the current limit function to limit the current flown from the gate of the GaN transistor after the GaN transistor turning off completely.

5. The apparatus according to claim 2, wherein the third transistor and the fourth transistor are the P-type metal-oxide-semiconductor (PMOS) field transistors.

6. The apparatus according to claim 1, wherein the first power supply is a low voltage source.

7. The apparatus according to claim 1, wherein the first transistor and the second transistor are the N-type metal-oxide-semiconductor (NMOS) field transistors.

* * * * *